United States Patent [19]

Kitao et al.

[11] Patent Number: 5,198,323
[45] Date of Patent: Mar. 30, 1993

[54] RESIST COMPOSITION CONTAINING ALKALI-SOLUBLE RESIN, 1,2-QUINONE DIAZIDE COMPOUND AND ANTI-HALATION COMPONENT

[75] Inventors: Teijiro Kitao, Tondabayashi; Masaru Matsuoka, Tenri; Ryotaro Hanawa, Ibaraki; Yasunori Uetani, Toyonaka; Naoki Takeyama, Settsu; Takeshi Hioki, Tondabayashi; Hiroshi Takagaki, Higashiosaka, all of Japan

[73] Assignee: Sumitomo Chemical Co., Ltd., Osaka, Japan

[21] Appl. No.: 694,372

[22] Filed: Apr. 30, 1991

[30] Foreign Application Priority Data

May 2, 1990 [JP] Japan .................................. 2-115982
May 2, 1990 [JP] Japan .................................. 2-115983
May 2, 1990 [JP] Japan .................................. 2-115984

[51] Int. Cl.$^5$ .......................... G03F 7/023; G03C 1/61
[52] U.S. Cl. .................................... 430/191; 430/165; 430/342; 430/343; 430/512; 430/519; 430/915; 430/920; 430/922
[58] Field of Search ............... 430/191, 512, 519, 342, 430/343, 920, 922, 915, 196

[56] References Cited

U.S. PATENT DOCUMENTS

| | | | |
|---|---|---|---|
| 3,916,069 | 10/1975 | Tiers et al. | 430/343 |
| 4,575,480 | 3/1986 | Kotani et al. | 430/192 |
| 4,617,373 | 10/1986 | Pruett et al. | 528/288 |
| 4,749,772 | 6/1988 | Weaver et al. | 528/288 |
| 4,927,732 | 5/1990 | Merrem et al. | 430/191 |
| 5,043,243 | 8/1991 | Yajima et al. | 430/191 |

FOREIGN PATENT DOCUMENTS 0392409 4/1990 European Pat. Off. .

*Primary Examiner*—Charles L. Bowers, Jr.
*Assistant Examiner*—Christopher G. Young
*Attorney, Agent, or Firm*—Birch, Stewart, Kolasch & Birch

[57] ABSTRACT

A resist composition comprising an alkali-soluble resin, a 1,2-quinone diazide compound and a compound of the general formula (I):

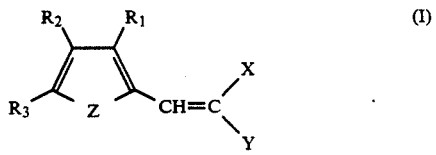

wherein Z is an oxygen or sulfur atom or a group of the formula: $>N-R_4$ in which $R_4$ is a hydrogen atom or an alkyl group; $R_1$, $R_2$ and $R_3$ are the same or different and independently a hydrogen atom, a substituted or unsubstituted alkyl group, a halogen atom, a hydroxyl group, a cyano group or a group of the formula: $-OCOR''$ in which $R''$ is a substituted or unsubstituted alkyl group; and X and Y are independently a cyano group or a group of the formula:

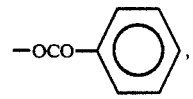

—COOR or —CONHR' in R is an alkyl group and R' is a hydrogen atom or an aryl group, which is suitable for the formation of very fine patterns on a substrate having a high reflectance.

13 Claims, 2 Drawing Sheets

RESIST COMPOSITION CONTAINING ALKALI-SOLUBLE RESIN, 1,2-QUINONE DIAZIDE COMPOUND AND ANTI-HALATION COMPONENT

BACKGROUND OF THE INVENTION

1. Field of the Invention

The present invention relates to a resist composition. More particularly, the present invention relates to a positive composition which is particularly suitable for the formation of very fine patterns on a substrate having a high reflectance such as an aluminum plate in the production of a semiconductive device such as IC or LSI.

2. Background of the Invention

Hitherto, in the production of an integrated circuit such as LSI, a resist composition comprising a quinone diazide type sensitizer and a novolak resin or comprising a bisazide type sensitizer and a cyclic rubber base resin is used.

In the production of the integrated circuit, fine patterns are drawn on various substrates through a resist composition. On a substrate having a high reflectance such as a substrate made of aluminum, aluminum-silicon or polysilicon, a conventional resist composition is sensitized in a region in which the composition should not be sensitized with reflected light from a substrate surface and/or side walls of stepped parts, resulting in notching or halation.

To overcome the above drawback and prevent deterioration of resolution, Japanese Patent Publication No. 7562/1976 proposes a resist composition comprising a dye of the formula:

(Oil Yellow, C.I.-11020) as a light absorber. By this dye, an amount of light which passes through a resist layer is greatly decreased and an amount of stray light to a light-shielded area is decreased.

However, by the addition of the light absorber, a sensitivity of the resist composition is, in general, greatly decreased so that productivity of the semiconductors is undesirably decreased.

Usually, in the formation of a resist film, the resist composition containing a solvent is coated on a wafer and then the coated wafer is prebaked to remove the solvent. Some light absorbers deposit during storage of the resist composition, or sublimates during prebaking, so that resist performances tend to vary.

SUMMARY OF THE INVENTION

One object of the present invention is to provide a resist composition which can prevent halation or notching on a substrate having high reflectance and provide a pattern stable against prebaking.

Another object of the present invention is to provide a highly sensitive resist composition a decrease level of sensitivity of which is small by the addition of a dye.

A further object of the present invention is to provide a resist composition suitable for fine pattern formation, which comprises a light absorber and in which compatibility of components is good.

A yet another object of the present invention is to provide a resist composition comprising a light absorber which does not precipitate in the resist composition during storage or in a resist film after coating and prebaking of the resist composition.

According to a first aspect of the present invention, there is provided a resist composition comprising an alkali-soluble resin, a 1,2-quinone diazide compound and a compound of the general formula (I):

wherein Z is an oxygen or sulfur atom or a group of the formula: $>N-R_4$ in which $R_4$ is a hydrogen atom or an alkyl group; $R_1$, $R_2$ and $R_3$ are the same and different and independently a hydrogen atom, a substituted or unsubstituted alkyl group, a halogen atom, a hydroxyl group, a cyano group or a group of the formula: $-O-COR''$ in which $R''$ is a substituted or unsubstituted alkyl group; and X and Y are the same or different and independently a cyano group or a group of the formula:

$-COOR$ or $-CONHR'$ in which R is an alkyl group and $R'$ is a hydrogen atom or an aryl group.

According to a second aspect of the present invention, there is provided a resist composition comprising an alkali-soluble resin, a 1,2-quinone diazide compound and a compound of the general formula (II)

wherein $R_5$, $R_6$ and $R_7$ are the same and different and independently a hydrogen atom, a substituted or unsubstituted alkyl group, a halogen atom or a hydroxyl group; and X and Y are the same as defined above.

According to a third aspect of the present invention, there is provided a resist composition comprising an alkali-soluble resin, a 1,2-quinone diazide compound and a compound of the general formula (III):

wherein $R_8$, $R_9$ and $R_{10}$ are the same or different and independently a hydrogen atom, a substituted or unsubstituted alkyl group or a halogen atom; and X and Y are the same as defined above.

According to a fourth aspect of the present invention, there is provided a resist composition comprising an alkali-soluble resin, a 1,2-quinone diazide compound and a compound of the general formula (IV):

(IV)

wherein $R_{11}$, $R_{12}$ and $R_{13}$ are the same or different and independently a hydrogen atom, a substituted or unsubstituted alkyl group, a halogen atom, a cyano group or a group of the formula: —OCOR″ in which R″ is the same as defined above; $R_{14}$ is a hydrogen atom or an alkyl group; and X and Y are the same as defined above.

DETAILED DESCRIPTION OF THE INVENTION

The compound (I) may be prepared by condensing a compound of the general formula:

(V)

wherein $R_1$, $R_2$, $R_3$ and Z are the same as defined above and a compound of the general formula:

(VI)

wherein X and Y are the same as defined above.

The condensation reaction is usually carried out in an inert organic solvent such as ethanol, n-propanol, toluene, benzene, chlorobenzene, chloroform, dimethylformamide, N-methylpyrrolidone, dimethylsulfoxide, sulfolane, acetonitrile or acetic anhydride.

The compound (V) and the compound (VI) are mixed in the above inert organic solvent. To the mixture, a catalyst, in particular, an organic base (e.g. piperidine, pyridine, triethylamine or a mixture of piperidine and glacial acetic acid) is added, and the reaction is carried out at a temperature of from 0° to 100° C., preferably from 20° to 80° C. for 0.1 to 20 hours, preferably 0.5 to 10 hours. By evaporating off the solvent from the reaction mixture, a crude cake of the compound (I) of the present invention is recovered. The crude cake can be purified by a per se conventional method such as recrystallization from a suitable solvent and the like.

In the above formulas, preferably, the alkyl group includes a $C_1$–$C_4$ alkyl group, and the aryl group includes a phenyl group or a naphthyl group. Examples of the substituent of the substituted alkyl are halogen atoms, a hydroxyl group, a phenyl group, a $C_1$–$C_3$ alkoxy group or a phenoxy group.

The compound (I) is used alone or in combination. Specific examples of the compound (I) are as follows:

-continued

-continued

The resist composition of the present invention comprising the compound (I) is used as either a negative resist composition or a positive resist composition, preferably as a positive resist composition. As the positive resist composition, one comprising an alkali-soluble resin and 1,2-quinone diazide compound is preferred. In particular, a composition comprising a novolak resin prepared by condensing a phenol compound and an aldehyde, and a 1,2-quinone diazide compound is preferred.

Examples of the phenol compound are phenol, o-, m- or p-cresol, 3,5-, 2,5-, 2,3-, 2,4-, 2,6- or 3,4-xylenol, 2,3,5-trimethylphenol, 2-tert.-butyl-5-methylphenol, 2-tert.-butyl-6-methylphenol, 2-tert.-butyl-4-methylphenol, resorcinol, and the like. They may be used alone or as a mixture by taking a solubility in an alkaline developer into consideration.

Examples of the aldehyde which is used in the condensation reaction with the phenol compounds are as formalin, paraformaldehyde, acetaldehyde, glyoxal, and the like. In particular, 37% formalin which is commercially available is preferably used.

As a catalyst to be used in the above reaction, any of conventionally used organic acids, inorganic acid and divalent metal salts can be used. Specific examples of the acid catalyst are oxalic acid, hydrochloric acid, sulfuric acid, perchloric acid, p-toluenesulfonic acid, trichloroacetic acid, phosphoric acid, formic acid, zinc acetate, manganese acetate, etc.

In general, the condensation reaction is carried out at a temperature of from 30° to 250° C. for 2 to 30 hours. The reaction may be carried out in the presence or absence of a solvent.

As the 1,2-quinone diazide compound, any one may be used. Examples of the 1,2-quinone diazide compound are 1,2-benzoquinone diazide-4-sulfonate ester, 1,2-naphthoquinone diazide-4-sulfonate ester, 1,2-naphthoquinone diazide-5-sulfonate ester, and the like. The quinone diazide compound is prepared by a conventional method, for example, by a condensation reaction of a naphthoquinone diazide sulfonyl chloride of a benzoquinone diazide sulfonyl chloride (e.g. naphthoquinone-(1,2)-diazide-(2)-5-sulfonyl chloride, naphthoquinone(1,2)-diazide-(2)-4-sulfonyl chloride or benzoquinone-(1,2)-diazide-(2)-4-sulfonyl chloride) with a compound having a hydroxyl group in the presence of a weak alkali.

Examples of the compound having a hydroxyl group are hydroquinone, resorcinol, phloroglucin, 2,4-dihydroxybenzophenone, 2,3,4-trihydroxybenzophenone, tetrahydroxybenzophenones such as 2,3,3',4-tetrahydroxybenzophenone, 2,3,4,4'-tetrahydroxybenzophenone and 2,2',4,4'-tetrahydroxybenzophenone, bis(p-hydroxyphenyl)methane, bis(2,4-dihydroxyphenyl)methane, bis(2,3,4-trihydroxyphenyl)methane, 2,2-bis(p-hydroxyphenyl)propane, 2,2-bis(2,4-dihydroxyphenyl)propane, 2,2-bis(2,3,4-trihydroxyphenyl)propane and hydrofravans. As the 1,2-quinone diazide compound, particularly preferred is a 1,2-naphthoquinone diazide-5-sulfonate ester of 2,3,4,4'-tetrahydroxybenzophenone in which at least two hydroxyl groups on the average are esterified or a hydrofravan of the formula:

wherein q is a number of 0 to 4 and r is a number of 1 to 5 provided that the sum of q and r is at least 2, and $R_{15}$, $R_{16}$ and $R_{17}$ are the same or different and independently a hydrogen atom, an alkyl group, an alkenyl group, a cyclohexyl group or an aryl group in which at least 2 hydroxyl groups on the average are esterified.

The 1,2-quinone diazide compounds may be used alone or as a mixture.

An amount of the alkali-soluble resin is larger than 30% by weight, preferably from 40 to 90% by weight based on the weight of (the solid components in) the composition.

An amount of the quinone diazide compound is from 5 to 50% by weight, preferably from 10 to 35% by weight based on the weight of the solid components in the composition.

An amount of the compound (I) in the resist composition is usually from 0.1 to 25% by weight, preferably from 0.2 to 10% by weight based on a weight of solid components in the composition. When the amount of the compound is in the above range, the resist composition prevents halation effectively and provides good profiles and sensitivity. In addition, the resist composition of the present invention may contain at least one additional compound.

As an exposure light, g-line (436 nm) and i-line (365 nm) may be used. Among them, i-line is preferred.

Therefore, among the compounds (I), those having maximum absorption in a wavelength range not longer than 550 nm, preferably from 300 to 450 nm, more preferably from 300 to 400 nm are used.

PREFERRED EMBODIMENTS OF THE INVENTION

The present invention will be illustrated by following Examples, in which "parts" are by weight.

Synthesis Example 1

To a mixture of a compound (0.96 g) of the formula:

(1)

and a compound (1.13 g) of the formula:

(2)

in benzene (100 ml), piperidine (0.1 ml) was added, and the mixture was stirred at 22° to 25° C. for 1 (one) hour. From the mixture, benzene was distilled off to obtain a crude cake. The crude cake was recrystallized from a mixed solvent of n-hexane and ethanol (1:1) to obtain a purified cake (1.54 g) of a compound of the formula:

(3)

Melting point: 82°–83° C.
$\lambda_{max}$: 340 nm (in ethanol)

Synthesis Example 2

To a mixture of a compound (1.10 g) of the formula:

(4)

and the compound (2) (1.13 g) in benzene (100 ml), piperidine (0.1 ml) was added, and the mixture was stirred at 22° to 25° C. for 30 minutes. From the mixture, benzene was distilled off to obtain a crude cake. The crude cake was recrystallized from a mixed solvent of n-hexane and ethanol (1:1) to obtain a purified cake (1.62 g) of a compound of the formula:

(5)

Melting point: 71°–72° C.
$\lambda_{max}$: 356 nm (in ethanol)

Synthesis Example 3

To a mixture of a compound (1.12 g) of the formula:

(6)

and a compound (0.66 g) of the formula:

(7)

in benzene (100 ml), piperidine (0.1 ml) was added, and the mixture was stirred at 22° to 25° C. for 30 minutes. From the mixture, benzene was distilled off to obtain a crude cake. The crude cake was recrystallized from n-hexane to obtain a purified cake (1.28 g) of a compound of the formula:

(8)

Melting point: 93.5°–95° C.
$\lambda_{max}$: 347 nm (in ethanol)

Synthesis Example 4

To a mixture of the compound (6) (1.12 g) and the compound (2) (1.13 g) in benzene (100 ml), piperidine (0.1 ml) was added, and the mixture was stirred at 22° to 25° C. for 30 minutes. From the mixture, benzene was distilled off to obtain a crude cake. The crude cake was recrystallized from a mixed solvent of n-hexane and ethanol (1:1) to obtain a purified cake (1.69 g) of a compound of the formula: Examples 1–6 in an amount shown in the Table were dissolved to prepare a resist composition.

The resist composition was coated on a 4 inch silicon wafer with an aluminum film on its surface by means of a spinner so as to form a resist film of 1.8 μm in thickness. Subsequently, the silicon wafer was prebaked for one minute on a hot plate kept at 100° C., and exposed to light (i-line of 365 nm) through a test reticle while varying the exposure value stepwise by means of a reduced projection exposing apparatus. Thereafter, the silicon wafer was developed by a static puddle method for 60 seconds at 23° C. in a developer SOPD (manufactured by Sumitomo Chemical Company, Limited) by means of an automatic developing machine. The results are shown in the Table.

In Table, a "relative sensitivity" is a ratio of an exposed amount of each of the resist composition to that of the resist composition of Comparative Example. An absorbance ratio is a ratio of the absorbance of each resist composition at 365 nm to that of the resist composition of Comparative Example.

The anti-halation effect was estimated as follow:

The method of estimation of a preventive effect of halation

1. Making a substrate having steps for estimation

Figure 1A:
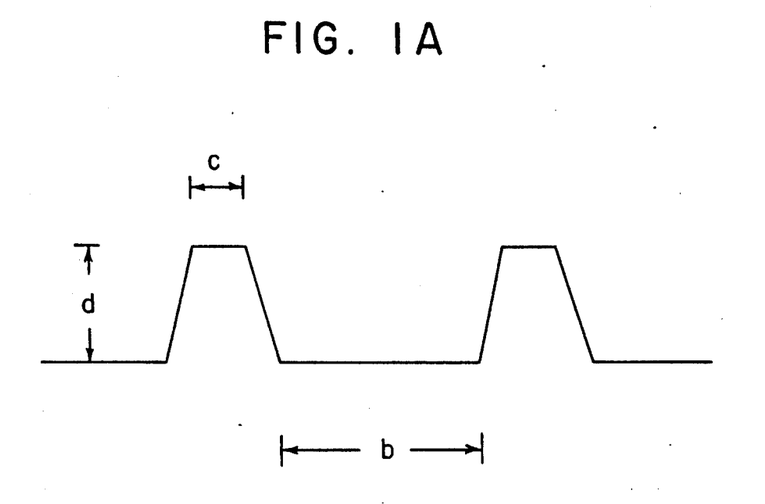
FIGS. 1A and 1B are a cross sectional view and a plane view of a stepped pattern for estimation, respectively
Figure 1B:
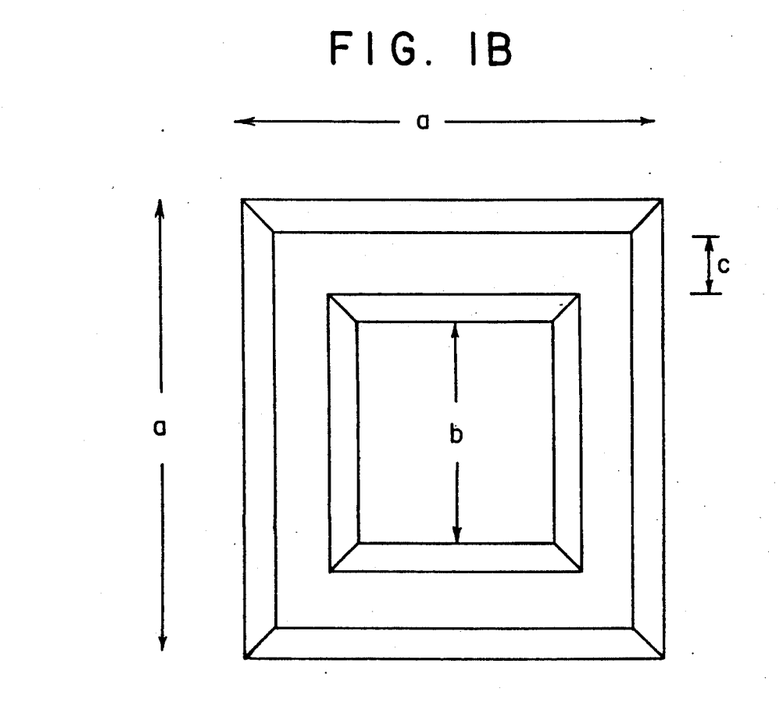

On a silicon substrate having a SiO₂ film of 1 μm in thickness, a pattern having steps a shape of which is (9)

Melting point: 92°–93° C.
$\lambda_{max}$: 343 nm (in ethanol)

Synthesis Example 5

To a mixture of a compound (1.26 g) of the formula:

(10)

and the compound (2) (1.13 g) in benzene (100 ml), piperidine (0.1 ml) was added, and the mixture was stirred at 22° to 25° C. for 1 (one) hour. From the mixture, benzene was distilled off to obtain a crude cake. The crude cake was recrystallized from n-hexane to obtain a purified cake (1.72 g) of a compound of the formula:

(11)

Melting point: 106.5°–108° C.
$\lambda_{max}$: 350 nm (in ethanol)

Synthesis Example 6

To a mixture of a compound (0.95 g) of the formula:

(12)

and the compound (2) (1.13 g) in benzene (100 ml), piperidine (0.1 ml) was added, and the mixture was stirred at 22° to 25° C. for 30 minutes. From the mixture, benzene was distilled off to obtain a crude cake. The crude cake was recrystallized from a mixed solvent of n-hexane and ethanol (1:1) to obtain a purified cake (1.52 g) of a compound of the formula:

(13)

Melting point: 136°–137.5° C.
$\lambda_{max}$: 363 nm (in ethanol)

EXAMPLES 1-6 AND COMPARATIVE EXAMPLE

In ethylcellosolve acetate, a cresol novolak resin (a polystyrene converted weight average molecular weight of 9600 by GPC) (15 parts), a condensate product of 1,2-naphthoquinone diazide-5-sulfonic chloride and in which 2.4 hydroxyl groups on the average were esterified (4 parts) and the compound prepared in each of Synthesis shown in FIGS. 1A and 1B was formed by photolithography, etching and aluminum spattering. Typical pattern sizes are a=4 μm, b=2 μm, c=1 μm and d=1 μm.

2. Estimation of anti-halation effect

On the above stepped substrate having high reflectance, a resist film of 1.8 μm in thickness was coated by the spin coat method.

Figure 2:
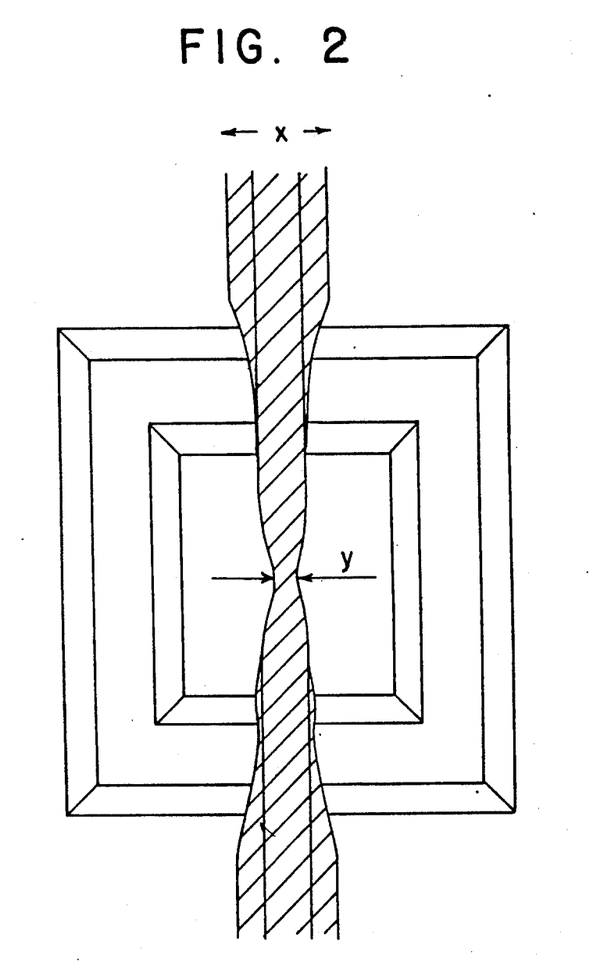
FIG. 2 is a plane view of a substrate after a resist composition is coated, exposed and developed, in which the hatched part indicates the resist.

The resist film was exposed to light and developed to make a resist line with a line width of 1.2 μm across the center of the flat concave part of the above pattern (see FIG. 2).

A decreasing ratio (R) of the resist line width in the concave center of the step (y) to a line width in the part having no step (x) was calculated according to the following equation:

$$R = \frac{x - y}{x}$$

The anti-halation effect is evaluated according to the following criteria:

Very good: The decreasing ratio of the line width is within 10%.
Good: The decreasing ratio of the line width is from 11 to 20%.
No good: The decreasing ratio of the line width is more than 20%.

COMPARATIVE EXAMPLE

The same procedures as in Example 1 were repeated except that no absorber was used. The halation preventing effect was evaluated by the same manner as in Examples. The results are shown in the Table.

As seen from the results of the Table, patterns with high sensitivity were formed in Examples of the present invention.

The pattern could be resolved sharply. No etching caused by reflected light on the side walls of patterns was found. The above results indicate that the resist compositions of the present invention are excellent in anti-halation effect.

In comparison with the resist composition of the present invention, the resist composition of Comparative Example had insufficient sensitivity and anti-halation effect.

TABLE

| Example No. | Compound | Parts | Relative sensitivity | Absorbance ratio | Antihalation effect |
|---|---|---|---|---|---|
| 1 | furan-CH=C(CN)(COOC₂H₅) | 0.27 | 1.3 | 3 | Very good |
| 2 | 5-methylfuran-CH=C(CN)(COOC₂H₅) | 0.13 | 1.2 | 3 | Very good |
| 3 | thiophene-CH=C(CN)(CN) | 0.20 | 1.2 | 3 | Very good |
| 4 | thiophene-CH=C(CN)(COOC₂H₅) | 0.17 | 1.2 | 3 | Very good |

TABLE-continued

| Example No. | Compound | Parts | Relative sensitivity | Absorbance ratio | Antihalation effect |
| --- | --- | --- | --- | --- | --- |
| 5 |  | 0.19 | 1.3 | 3 | Very good |
| 6 |  | 0.12 | 1.2 | 3 | Very good |
| Comp. | No absorber | 0 | 1 | 1 | No good |

What is claimed is:

1. A resist composition comprising, in admixture, an alkali-soluble resin, a 1,2-quinone diazide compound and a compound of the general formula (I):

(I)

wherein Z is an oxygen or sulfur atom or a group of the formula: >N—R$_4$ in which R$_4$ is a hydrogen atom or an alkyl group; R$_1$, R$_2$ and R$_3$ are the same or different and independently a hydrogen atom, a substituted or unsubstituted alkyl group, a halogen atom, a hydroxyl group, a cyano group or a group of the formula: —OCOR'' in which R'' is a substituted or unsubstituted alkyl group; and X and Y are independently a cyano group or a group of the formula:

—CO—⬡,

—COOR or —CONHR' in which R is an alkyl group and R' is a hydrogen atom or an aryl group, wherein an amount of said alkali-soluble resin is larger than 30% by weight, an amount of said 1,2-quinone diazide compound is from 5 to 50% by weight, and an amount of said compound of the general formula (I) is from 0.1 to 25% by weight based on a total weight of solid components in the resist composition.

2. The resist composition according to claim 1, wherein said compound (I) is a compound of the general formula (II):

(II)

wherein R$_5$, R$_6$ and R$_7$ are the same or different and independently a hydrogen atom, a substituted or unsubstituted alkyl group, a halogen atom or a hydroxyl group; and X and Y are the same as define above.

3. The resist composition according to claim 2, wherein said compound (II) is a compound of the formula:

4. The resist composition according to claim 2, wherein said compound (II) is a compound of the formula:

5. The resist composition according to claim 1, wherein said compound (I) is a compound of the general formula (III):

(III)

wherein R$_8$, R$_9$ and R$_{10}$ are the same or different and independently a hydrogen atom, a substituted or unsubstituted alkyl group or a halogen atom; and X and Y are the same as defined above.

6. The resist composition according to claim 5, wherein said compound (III) is a compound of the formula:

7. The resist composition according to claim 5, wherein said compound (III) is a compound of the formula:

8. The resist composition according to claim 5, wherein said compound (III) is a compound of the formula:

9. The resist composition according to claim 1, wherein said compound (I) is a compound of the general formula (IV):

(IV)

wherein $R_{11}$, $R_{12}$ and $R_{13}$ are the same or different and independently a hydrogen atom, a substituted or unsubstituted alkyl group, a halogen atom, a cyano group or a group of the formula: —OCOR″ in which R″ is the same as defined above; $R_{14}$ is a hydrogen atom or an alkyl group; and X and Y are the same as defined above.

10. The resist composition according to claim 9, wherein said compound (IV) is a compound of the formula:

11. The resist composition according to claim 2, wherein said compound (II) is a compound selected from the group consisting of:

-continued

-continued and

12. The resist composition according to claim 5, wherein said compound (II) is a compound selected from the group consisting of:

-continued and

13. The resist composition according to claim 9, wherein said compound (II) is a compound selected from the group consisting of:

-continued

-continued and

* * * * *